United States Patent [19]

Veendrick et al.

[11] Patent Number: 4,707,844

[45] Date of Patent: Nov. 17, 1987

[54] INTEGRATED CIRCUIT HAVING REDUCED CLOCK CROSS-TALK

[75] Inventors: Hendrikus J. M. Veendrick; Adrianus T. Van Zanten; Leonardus C. M. G. Pfennings, all of Eindhoven, Netherlands

[73] Assignee: U.S. Philips Corporation, New York, N.Y.

[21] Appl. No.: 875,806

[22] Filed: Jun. 18, 1986

[30] Foreign Application Priority Data

Jun. 26, 1985 [NL] Netherlands ........................ 8501835

[51] Int. Cl.4 ........................ H03K 23/46; G11C 7/02

[52] U.S. Cl. ........................................ 377/58; 377/60; 307/550

[58] Field of Search ...................... 377/105, 57, 58, 60, 377/63; 370/6; 375/108; 328/62; 307/550

[56] References Cited

U.S. PATENT DOCUMENTS 3,927,334 12/1975 Callahan ............................ 307/269

3,950,654 4/1976 Broedner et al. ..................... 328/62

3,967,136 6/1976 Krambeck ............................ 377/58

3,983,413 9/1976 Gunsager et al. .................... 377/58

4,230,951 10/1980 Suzuki et al. ....................... 377/105

4,509,181 4/1985 Sauer .................................. 377/60

*Primary Examiner*—John S. Heyman

*Attorney, Agent, or Firm*—Robert T. Mayer; Steven R. Biren

[57] ABSTRACT

Charge-coupled devices are very sensitive to clock cross-talk due to the overlap between successive electrodes. The influence of this cross-talk is reduced when the clock lines are periodically connected to ground by a low-ohmic impedance. For this purpose, each clock line is controlled from a buffer, whose output is connected to a clock line. A clamping transistor is connected between the output and ground. When this clamping transistor is controlled by means of the output signal and at the same time by the input signal of the buffer, the output is clamped to ground at the instant at which the cross-talk is expected by means of only a single clamping transistor.

4 Claims, 5 Drawing Figures

VDD
T7 T6 T1 T4 C T3 T8 T11 O T20 I T2 T5 15 VSS VDD T24 T22 H F T23 T25 T21 VSS

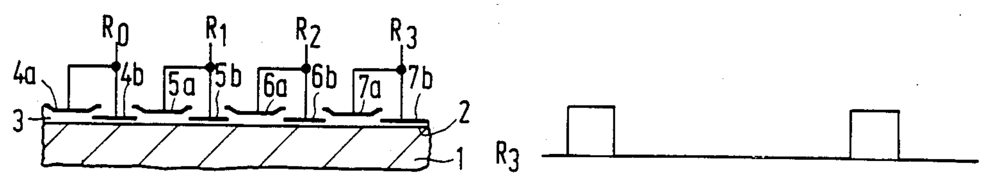
FIG. 1
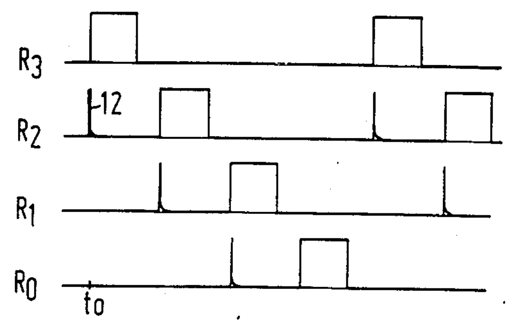
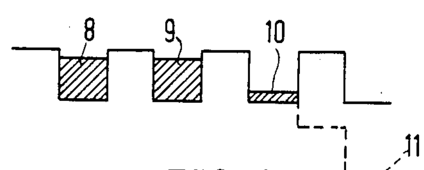
FIG. 2
FIG. 3
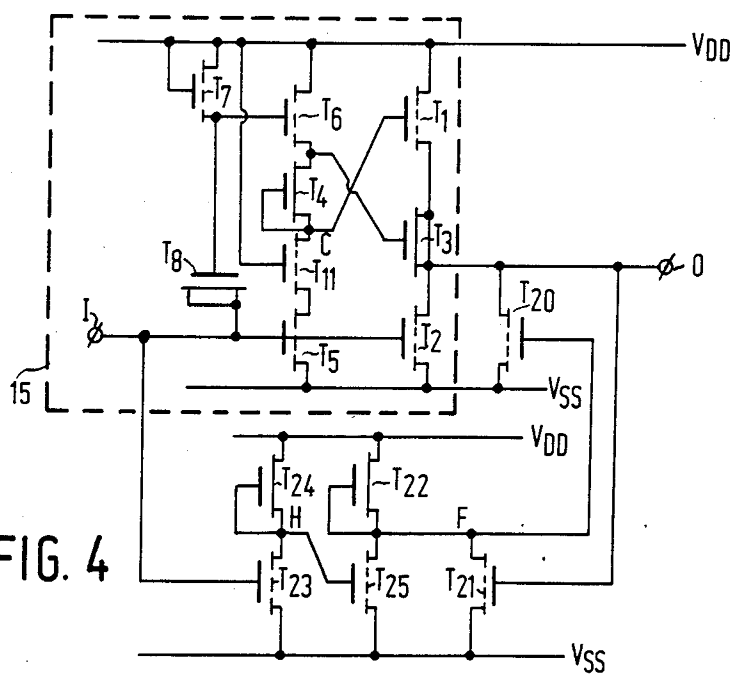
FIG. 4
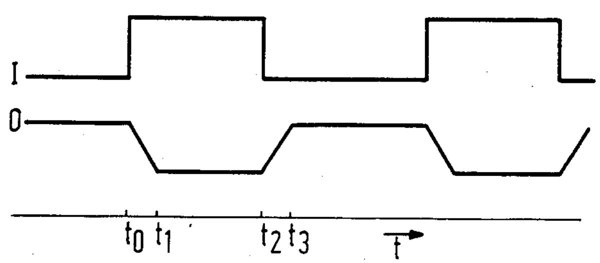
FIG. 5

INTEGRATED CIRCUIT HAVING REDUCED CLOCK CROSS-TALK

BACKGROUND OF THE INVENTION

The invention relates to an integrated circuit, more particularly but not exclusively to a charge-coupled device comprising a clock voltage generator circuit having a number of clock lines for receiving and transferring clock voltages which have a reference level and an active level, each clock line being connected to the output of a first inverter circuit, whose input is connected to means for applying a pulse voltage, while each clock line is connected to a switch in the form of an insulated gate field effect transistor (designated hereinafter as a clamping transistor), which is open when the clock line is at the active level and which, when the clock voltage is at the reference level, forms a low-impedance connection between the clock line and a point which is also at the reference level. Such a circuit arrangement is known inter alia from U.S. Pat. No. 4,230,951.

Charge-coupled devices are devices in which a pattern of potential wells and potential barriers is induced at or near the surface of a semiconductor body by means of clock voltages which are applied to a series of clock electrodes located above the surface. Information can be stored and transported in the device in the form of discrete packets of electrical charge which are stored in the potential wells and are mutually insulated by the potential barriers. The information can be displaced by applying a clock electrode, below which no information is stored, to the active voltage level, as a result of which a deeper potential well is generated below this clock electrode than below an adjacent clock electrode which remains at the reference level and below which charge is stored. This charge can flow into the deeper potential well below the first-mentioned clock electrode. The clock voltages are supplied to the clock electrodes via the clock lines, which are alternately connected to one of the clock electrodes.

At the instant at which the first-mentioned electrode is applied to the active voltage level, the voltage at the adjacent electrode can vary due to capacitive coupling. As a result, the potential profile below the adjacent clock electrode can change so that distortion of the information stored below the adjacent clock electrode can occur. More particularly, it is then possible that the voltage at the preceding electrode deviates to such an extent from the reference level that the potential well below this clock electrode also becomes much deeper and attracts charge of the charge packet stored below the preceding electrode. The voltage at the succeeding electrode may also deviate to such an extent that the potential well below this electrode becomes much less deep and charge flows from below this electrode to below the succeeding electrode.

In types of integrated circuits other than the charge-coupled devices described herein, such as in, for example, memories, such noise problems due to cross-talk between the clock lines or between the elements controlled by the clock lines may also arise.

FIG. 5 of U.S. Pat. No. 4,230,951 indicates a method of solving the problem of clock cross-talk in that by means of switches the clock lines, which are at the reference level, are clamped via a low impedance at the reference level at the instant at which the cross-talk is expected. In the known device described, for this purpose, in the case of n clock lines, each clock line is connected via (n-1) clamping transistors to a common point at the reference level, these (n-1) clamping transistors each being controlled by one of the (n-1) remaining clock lines. The clamping transistor, whose gate is connected to the clock line applied to the active level, becomes conducting and clamps the associated clock line and hence the clock electrodes controlled by this clock line at the reference level. The remaining (n-2) clamping transistors connected to this clock line remain non-conducting. This known device has the disadvantage that each clock line requires several clamping transistors. In general these clamping transistors occupy much space because of the requirements imposed on the low-ohmic character in the conductive state.

SUMMARY OF THE INVENTION

The present invention has inter alia for its object to provide an integrated circuit of the general kind described, above in which each clock line is provided only with a single clamping transistor.

An integrated circuit according to the invention is characterized in that the gate electrode of the clamping transistor is connected via an inverter circuit, designated hereinafter as a second inverter circuit, to the clock line, which is connected to the input of the second inverter circuit, and in that the input of the first inverter circuit is connected via a third inverter circuit and a fourth inverter circuit connected in series with it also to the gate electrode of the clamping transistor.

By the use of the invention it is achieved that each clock line—and hence the elements controlled by this clock line—can be clamped at the reference level by means of only a single clamping transistor, which, due to the fact that it is controlled both by the input signal and by the output signal of the first inverter circuit, switches on and off at the right instants.

BRIEF DESCRIPTION OF THE DRAWING

The invention will be described more fully with reference to an embodiment and the accompanying diagrammatic drawing, in which:

FIG. 1 is a sectional view of a part of a conventional charge-coupled device;

FIG. 2 shows a potential profile induced during operation in the part shown in FIG. 1 in the channel;

FIG. 3 shows a diagram of usual clock voltages $R_0$–$R_3$, which are applied in these devices to the clock electrodes;

FIG. 4 shows the circuit diagram of an integrated buffer circuit according to the invention; and FIG. 5 shows the input voltage $V_{in}$ and the output voltage $V_o$ of the buffer circuit shown in FIG. 4 as a function of the time t.

DESCRIPTION OF THE PREFERRED EMBODIMENT

For explanation of the problems that can arise due to clock cross-talk, FIG. 1 shows in sectional view a part of a conventional charge-coupled device. An n-channel device of the surface type is chosen by way of example. However, it will be appreciated that the invention may also be used with p-channel devices, with devices of the buried channel type, with charge transfer devices of the BBD-type and with other types of integrated circuits, such as dynamic memories, in which stored information can be lost due to clock cross-talk.

The charge transport channel of the charge-coupled device is defined at the surface 2 of a p-type semiconductor body 1. The semiconductor body 1 is made, for example, of silicon, but may of course also consist of another suitable material. A thin dielectric layer 3 of, for example, silicon oxide is provided on the surface 2. Clock electrodes 4,5,6,7 each comprising a part a and a part b are formed on the oxide layer 3. The parts *4a*,-*5a*,*6a* and *7a* are located on thicker parts of the oxide layer 3 and form so-called transfer parts of the clock electrodes. The parts *4b*,*5b*,*6b* and *7b* are located on thinner parts of the oxide layer 3 and form the storage parts. As is known, potential profiles are induced at the surface 2 by applying clock voltages to the clock electrodes, potential wells, in which charge can be stored, being formed below the storage parts b. Below the transfer parts a, potential barriers are formed, which mutually separate the charge packets and determine the charge transport direction.

The device is operated (by way of example) in the so-called one-bit/electrode mode, in which (n-1) charge packets are stored in a group of n successive electrodes and the empty storage site is displaced in the direction opposite to the charge transport direction through the group. FIG. 2 shows this method. In this Figure a full line indicates the potential profile in the channel when the electrodes 4–7 are at reference potential. The substrate is then assumed to be applied to a negative voltage, for example −3.5 V. In the channel four potential wells are induced, in which three charge packets 8,9 (corresponding to a logic "1") and 10 (corresponding to a logic "0") are situated. The potential well below the clock electrode 7 is empty. When the clock voltage $R_3$ at the clock electrode 7 passes to the active higher level, the surface potential below the electrode 7 decreases, as is indicated in FIG. 2 by a broken line 11. The active level of the clock $R_3$ should be so high that the level of the barrier *7a* is lower than the potential level of the potential well below *6b*. The charge packet 10 in the potential well below the electrode *6b* can flow into the potential well below the electrode *7b*. When the charge packet has entirely been transferred, $R_3$ can be reset to the reference level. The potential profile then corresponds again to the profile indicated by the full line in FIG. 2, with the only difference being that the charge packet 10 is stored not below *6b*, but below *7b*. When subsequently the clock voltage $R_2$ is set to the active level, the charge packet 9 can be displaced in an analogous manner from the potential well below *5b* to the potential well below *6b*. When therefore the clock electrodes 7,6,5 and 4 are successively set to the active level by means of the pulses $R_3$, $R_2$, $R_1$ and $R_0$, the charge pattern 8,9,10 can be shifted one position to the right. When this operation is periodically repeated, the charge pattern can be transported through the whole channel.

In FIG. 3, the clock voltages $R_3$, $R_2$, $R_1$ and $R_0$ are shown diagrammatically as a function of time. In this Figure, the disturbance signals are also indicated, which can occur due to the cross-talk between the clock electrodes and under certain conditions can very adversely affect the operation of the device. The cross-talk is inter alia due to the overlap between the clock electrodes. When, for example, at $t_o$ the clock $R_3$ passes to the active level, $R_2$ will also perform a voltage jump due to the cross-talk. The clock electrode 6 does not remain at the reference voltage, but in fact clocks together with $R_3$. In FIG. 3, this is indicated by the voltage peak 12. The potential well and barrier below the clock electrode 6 will decrease due to this voltage peak. This decrease may be so strong that the level of the potential barrier below the transfer part *6a* falls below the level of the charge 9. In this situation, charge 9 from the potential well below the clock electrode 5 can be added to the charge packet 10 below the clock electrode 6.

FIG. 4 shows the circuit diagram of a circuit with which the disadvantage mentioned above is avoided. The part 15 enclosed by a broken line is illustrated and described with reference to FIG. 3 of the prior Netherlands patent application No. 8400523, filed on Feb. 20th 1984 corresponding to U.S. patent application Ser. No. 698,999 and whose contents are incorporated in the present Application. For the sake of clarity, the elements of the circuit enclosed by the broken line 15 are provided with the same reference numerals as the corresponding elements in FIG. 3 of the prior Application. For a detailed description of the part 15, reference is made to the prior Application. In principle, this part comprises a bootstrapped buffer, by which a (weak) input signal I is converted into one of the amplified signals that can be derived at the output O.

It should be noted that in the drawing the channels between source and drain zones of transistors of the enhancement type are indicated by a broken line and those of transistors of the depletion type by a full line.

The buffer 15 comprises an inverter circuit with a transistor $T_2$ as inverter transistor and a transistor $T_1$ as load transistor. The input signal I is supplied to the gate of $T_2$. The gate electrode of the transistor $T_1$ is connected via the transistor $T_4$ to the bootstrap capacitance constituted by the transistor $T_3$. For this purpose, the gate electrode of $T_1$ is connected to the junction C, to which the gate electrode of the depletion transitor $T_4$ is also connected. The point C is connected via a series-combination of the transitors $T_{11}$ and $T_5$ to the point $V_{ss}$. The gate electrode of $T_5$ is connected to the terminal to which the input signal I is supplied. The gate electrode of $T_{11}$ is connected to the positive supply $V_{DD}$. The drain of $T_4$ is connected together with the gate electrode of $T_3$ to the source of the transistor $T_6$, whose drain is connected to the positive supply $V_{DD}$. The gate electrode of $T_6$ is connected on the one hand via the transistor $T_7$ connected as a diode to $V_{DD}$ and on the other hand via the transistor $T_8$ connected as a capacitance to the input terminal I.

In order to clamp the output terminal O at the reference level, i.e. the level $V_{SS}$, the clamping transistor $T_{20}$ is connected between the terminal O and the terminal $V_{SS}$. The gate electrode of the transistor $T_{20}$ is connected via an inverter circuit (designated hereinafter as second inverter circuit), which comprises the transistors $T_{21}$ and $T_{22}$, to the output terminal O and hence to the clock line connected to this terminal. The transistor $T_{21}$ is of the enhancement type and comprises a source which is connected to $V_{SS}$ and a drain connected to the point F, which is also connected to the gate electrode of the clamping transistor $T_{20}$. The gate electrode of $T_{21}$ is connected to the output terminal O. The drain of the transistor $T_{21}$ (point F) is connected to the source of the load transistor $T_{22}$. The gate electrode of this transistor, which is of the depletion type, is connected to the source. The drain of the transistor $T_{22}$ is connected to $V_{DD}$. The gate electrode of the clamping transistor is coupled not only to the output O, but also to the input I of the buffer 15 via two series-connected inverter circuits, designated hereinafter as third and fourth inverter circuits. The third inverter circuit comprises the inverter transistor $T_{23}$ of the enhancement type and the load transistor $T_{24}$ of the depletion type. The input I is connected to the gate electrode of the inverter transistor $T_{23}$, whose source is connected to $V_{SS}$ and whose drain is connected to the junction H. The junction H is also connected to the source and the gate of the load transistor $T_{24}$, whose drain is connected to $V_{DD}$. The junction H constituting the output of the inverter circuit $T_{23}$, $T_{24}$ is connected to the input of the fourth inverter circuit which comprises the inverter transistor $T_{25}$ and the load transistor $T_{22}$, which also forms part of the second inverter circuit $T_{21}$, $T_{22}$. The inverter transistor $T_{25}$, which is of the enhancement type, comprises a source connected to $V_{SS}$ a gate electrode connected to the junction H and a drain connected to the junction F.

The operation of the clamping circuit shown in FIG. 4 is explained with reference to FIG. 5, in which the input signal I and the output signal O are shown as a function of the time t. For the sake of simplicity, a clock voltage having substantially straight edges is chosen for the input signal I. The input signal is inverted and amplified by the buffer 15 in the manner described in the prior Application mentioned above. In order to limit the cross-talk of the remaining clocks $R_1$, the transistor $T_2$ is preferably a transistor for which a comparatively small W/L ratio (width-to-length ratio), dependent upon the load of the buffer, is chosen, as a result of which the edges of the output signal O are less steep than those of the input signal I. In the period preceding $t_o$, I is low and so O is high. In this situation, the transistor $T_{23}$ is non-conducting so that the point H is high and hence the input signal at the transistor $T_{25}$ is also high. At the same time, the gate of the transistor $T_{21}$ is also high so that the point F is low. The clamping transistor $T_{20}$ in this situation is non-conducting (open). When, at $t_o$, I becomes high, O decreases gradually and is low only at the instant $t_1$. At the instant at which I becomes high, the transistor $T_{23}$ becomes conducting, as a result of which H decreases and the transistor $T_{25}$ becomes non-conducting. The potential of the junction F can slightly increase, but due to the fact that the output terminal O remains sufficiently high owing to inertia effects, the transistor $T_{21}$ remains conducting. The junction F then still remains so low that the transistor $T_{20}$ does not become conducting. The transistor $T_{21}$ becomes non-conducting only when the output terminal O has fallen practically to the low level (reference level) ($t_1$ in FIG. 5). Since at this instant $T_{25}$ is also non-conducting, the potential of the junction F increases, as a result of which the clamping transistor $T_{20}$ becomes conducting. The output terminal O is now clamped via the low impedance of the clamping transistor $T_{20}$ at $V_{SS}$.

At the instant $t_2$ I again falls to the low level, in which event the voltage at H increases and the voltage at F decreases, as a result of which $T_{20}$ immediately becomes non-conducting. The voltage at the output gradually increases again and has reached the active level again at $t_3$.

Summarizing, it may be said that at the trailing edge of the output signal O (between $t_o$ and $t_1$), the instant at which the clamping transistor $T_{20}$ becomes conducting is determined by the output signal O. To the contrary, the instant at which at the leading edge of the output signal O (between $t_2$ and $t_3$) the clamping transistor $T_{20}$ becomes non-conducting again, is determined by the input signal I. Thus, it is achieved that the clamping transistor $T_{20}$ is conducting only in the time interval between $t_1$ and $t_2$ when the output O is at the lowest level. The output terminal O can thus effectively be clamped at $V_{SS}$ by means of only a single clamping transistor. The output signal O may advantageously have slanting ramps, as is indicated in FIG. 5, as a result of which cross-talk from the output signal O to other clock lines can be reduced. The slanting ramp in the output signal O can be obtained by choosing a very small width-to-length ratio for the channel of the transistor $T_2$ of the first inverter circuit $T_1$, $T_2$ of the buffer 15. A favorable configuration, in which it is possible to combine a high insensitivity to disturbance with the desired output signal O with the use of such a transistor $T_2$, is obtained in that a width-to-length ratio is chosen for the channel of the clamping transistor $T_{20}$ which is at least 5 times and preferably at least 7 times larger.

It will be appreciated that the invention is not limited to the embodiment shown here, but that many further variations are possible for those skilled in the art without departing from the scope of the invention. For example, the invention may also be used in 2-, 3- or 4-phase charge-coupled devices. Besides in charge-coupled devices, the invention may also be used in other types of integrated circuits, such as memories.

What is claimed is:

1. A clock line buffer circuit for use in an integrated circuit having a clock electrode and a clock line for applying a buffered clock voltage having a reference level and an active level to said clock electrode, which comprises:

a first inverter circuit having an input for receiving an unbuffered clock voltage and an output for providing said buffered clock voltage to said clock line;

a clamping FET transistor switch having a drain electrode connected to said first inverter output, a source electrode connected to said reference level, and a gate electrode, said clamping transistor being open when said first inverter output is at the active level and forming a low-impedance connection between said first inverter output and the reference level when said first inverter output is at the reference level;

a second inverter circuit having an input connected to said first inverter output and an output connected to the gate electrode of said clamping transistor for coupling said gate electrode to said first inverter output;

a third inverter circuit having an input connected to said first inverter input and an output; and a fourth inverter circuit having an input connected to the output of said third inverter circuit and an output connected to the gate of said clamping transistor.

2. A clock line buffer circuit as claimed in claim 1, characterized in that the first inverter circuit comprises an inverter insulated gate field effect transistor, whose source and drain zones are connected to the source and drain zones, respectively, of the clamping transistor and in which the width-to-length ratio W/L of the channel is smaller than the width-to-length ratio of the channel of the clamping transistor.

3. A clock line buffer circuit as claimed in claim 2, characterized in that the width-to-length ratio of the channel of said inverter transistor is no more than one fifth the width-to-length ratio of the channel of the clamping transistor.

4. A plurality of clock line buffer circuits as claimed in claim 1, 2 or 3, characterized in that the integrated circuit comprises a charge-coupled device having a plurality of clock electrodes, each clock electrode receiving a buffered clock voltage from its associated clock buffer circuit.

* * * * *